US007158428B2

(12) United States Patent
Fujimoto (10) Patent No.: US 7,158,428 B2
(45) Date of Patent: Jan. 2, 2007

(54) SEMICONDUCTOR MEMORY DEVICE HAVING HIERARCHICAL BIT LINE STRUCTURE

(75) Inventor: Yukihiro Fujimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 10/997,919

(22) Filed: Nov. 29, 2004

(65) Prior Publication Data
US 2005/0125591 A1 Jun. 9, 2005

(30) Foreign Application Priority Data
Nov. 28, 2003 (JP) ............................. 2003-400120

(51) Int. Cl.
*G11C 7/00* (2006.01)
(52) U.S. Cl. ............. 365/203; 365/189.01; 365/185.14
(58) Field of Classification Search ................ 365/203, 365/230.03, 51, 63, 190, 129, 189.01, 185.14
See application file for complete search history.

(56) References Cited

U.S. PATENT DOCUMENTS 6,091,629 A * 7/2000 Osada et al. ................ 365/156
6,542,424 B1 * 4/2003 Endo et al. .................. 365/205

OTHER PUBLICATIONS

Cangsang Zhao et al., An 18Mb, 12.3GB/s CMOS Pipeline-Burst Cache SRAM with 1.54Gb/s/pin, IEEE International Solid-State Circuits Conference Digest of Technical Papers, Session 11, Paper TA 11.6, Feb. 16, 1999, pp. 200, 201 and 461.

* cited by examiner

*Primary Examiner*—Richard Elms
*Assistant Examiner*—Dang Nguyen
(74) *Attorney, Agent, or Firm*—Oblon, Spivak, McClelland, Maier & Neustadt, P.C.

(57) ABSTRACT

A semiconductor memory device comprising: a memory array including a plurality of memory cells; a plurality of word lines corresponding to the respective memory cells; a pair of local bit lines corresponding to the memory array; a pair of global bit lines corresponding to the pair of local bit lines; a precharge circuit including an output terminal being connected to the pair of local bit lines; a local write amplifier circuit including a data input terminal being connected to the pair of global bit lines and an output terminal being connected to the pair of local bit lines; and a control signal line being connected to an input terminal of the precharge circuit and to a control input terminal of the local write amplifier circuit, wherein the local write amplifier circuit is deactivated by the control signal line when the precharge circuit is activated, and the precharge circuit is deactivated by the control signal line when the local write amplifier circuit is activated.

16 Claims, 9 Drawing Sheets

SEMICONDUCTOR MEMORY DEVICE HAVING HIERARCHICAL BIT LINE STRUCTURE

CROSS REFERENCE TO RELATED APPLICATION

This application is based upon and claims the benefit of priority from the prior Japanese Patent Application No. 2003-400120 filed on Nov. 28, 2003; the entire contents of which are incorporated herein by reference.

BACKGROUND OF THE INVENTION

1. Field of the Invention

The present invention relates to a semiconductor memory device having a hierarchical bit line structure.

2. Discussion of the Background

Along with an increase in capacity of a semiconductor memory device in recent years, a large-capacity memory array is connected to a pair of bit lines. As a result, a load capacity of a bit line is increased and such an increase causes reduction in operating speed.

Moreover, when reading data stored in a memory cell selected by use of bit lines with increased load capacities, a sense amplifier having a sufficiently small input offset is required for sensing small variations in amplitude of an output signal from a selected pair of bit lines. Accordingly, it is necessary to increase an area for the sense amplifier.

However, along with developments in miniaturization of semiconductors, an influence of uneven characteristics among elements is growing larger. Therefore, it becomes increasingly difficult to form a sense amplifier having a sufficiently small input offset.

Accordingly, a conceivable method for preventing reduction in operating speed and increasing detectable amplitude as much as possible is to divide a memory array to be connected in a column direction to each pair of bit lines into a plurality of sub-memory arrays. In this way, it is possible to reduce a load capacity to be applied to a bit line by means of reducing the number of memory cells to be connected thereto. As disclosed in Cangsang Zhao, Uddalak Bhattacharya, Martin Denham, Jim Kolousek, Yi Lu, Yong-Gee Ng, Novat Nintunze, Kamal Sarkez, Hemmige Varadarajan, "An 18 Mb, 12.3 GB/s CMOS Pineline-Burst Cache SRAM with 1.54 Gb/s/pin", 1999 IEEE International Solid-State Circuits Conference, p200–201, a semiconductor memory device according to this method comprises hierarchical bit lines including local bit lines which are bit lines connected to respective sub-memory arrays, and global bit lines which are common bit lines corresponding to a plurality of sub-memory arrays on every column.

In the semiconductor memory device having the above-described hierarchical bit line structure, it is possible to transmit data inputted to the global bit line to the local bit line so as to write the data into a predetermined memory cell. A local write amplifier circuit is inserted between the global bit line and the local bit line for controlling passage of a signal from the global bit line to the local bit line. The local write amplifier circuit is controlled by a write enable signal.

In the meantime, it is necessary to charge the local bit line before reading the data stored in the memory cell. For this reason, the local bit line is provided with a precharge circuit. This precharge circuit is controlled by a precharge control signal which is generated by decoding address data.

Signal lines for controlling the local write amplifier circuits and signal lines for controlling the precharge circuits are different. Accordingly, these signal lines occupy a large circuit area.

Moreover, transfer gates and clocked transistors are used for the local write amplifier circuits to suppress signal transmission losses. Accordingly, the local write amplifier circuits occupy a relatively large circuit area. Since the local write amplifier circuit is provided in every sub-memory array, the local write amplifier circuits cause an increase in the total area of the circuit.

SUMMARY OF THE INVENTION

According to one aspect of the present invention, a semiconductor memory device comprises: a memory array including a plurality of memory cells; a plurality of word lines corresponding to the respective memory cells; a pair of local bit lines corresponding to the memory array; a pair of global bit lines corresponding to the pair of local bit lines; a precharge circuit including an output terminal being connected to the pair of local bit lines; a local write amplifier circuit including a data input terminal being connected to the pair of global bit lines and an output terminal being connected to the pair of local bit lines; and a control signal line being connected to an input terminal of the precharge circuit and to a control input terminal of the local write amplifier circuit, wherein the local write amplifier circuit is deactivated by the control signal line when the precharge circuit is activated, and the precharge circuit is deactivated by the control signal line when the local write amplifier circuit is activated.

According to another aspect of the present invention, a semiconductor memory device comprises: a plurality of word lines extending in a row direction; a plurality of pairs of local bit lines extending in a column direction; a plurality of memory cells respectively arranged in row and column directions, the memory cells being connected to the word line on every row and connected to the pair of local bit lines on every column; a pair of global bit lines extending in the column direction and corresponding to the plurality of pairs of local bit lines; a plurality of precharge circuits each including an input terminal being connected to a control signal line and an output terminal being connected to the plurality of pairs of local bit lines, the precharge circuits being activated during a period when the control signal line is set to a first polarity; and a plurality of local write amplifier circuits each including a data input terminal being connected to the pair of global bit lines, a control input terminal being connected to the control signal line, and an output terminal being connected to the plurality of pairs of local bit lines, the local write amplifier circuits being activated during a period when the control signal line is set to a second polarity.

BRIEF DESCRIPTION OF THE DRAWINGS

These and other advantages of the invention will become more apparent and more readily appreciated from the following detailed description of the exemplary embodiments of the invention taken in conjunction with the accompanying drawings.

FIGS. 4A and 4B are flow charts corresponding to the circuit of FIG. 1.

FIGS. 5A and 5B are flow charts corresponding to the circuit of FIG. 2.

FIGS. 7A and 7B are timing-charts corresponding to the circuit of FIG. 1.

FIGS. 8A and 8B are timing-charts corresponding to the circuit of FIG. 2.

DETAILED DESCRIPTION OF THE INVENTION

Now, exemplary embodiments of the present invention will be described with reference to the accompanying drawings.

(First Embodiment)

Figure 1:
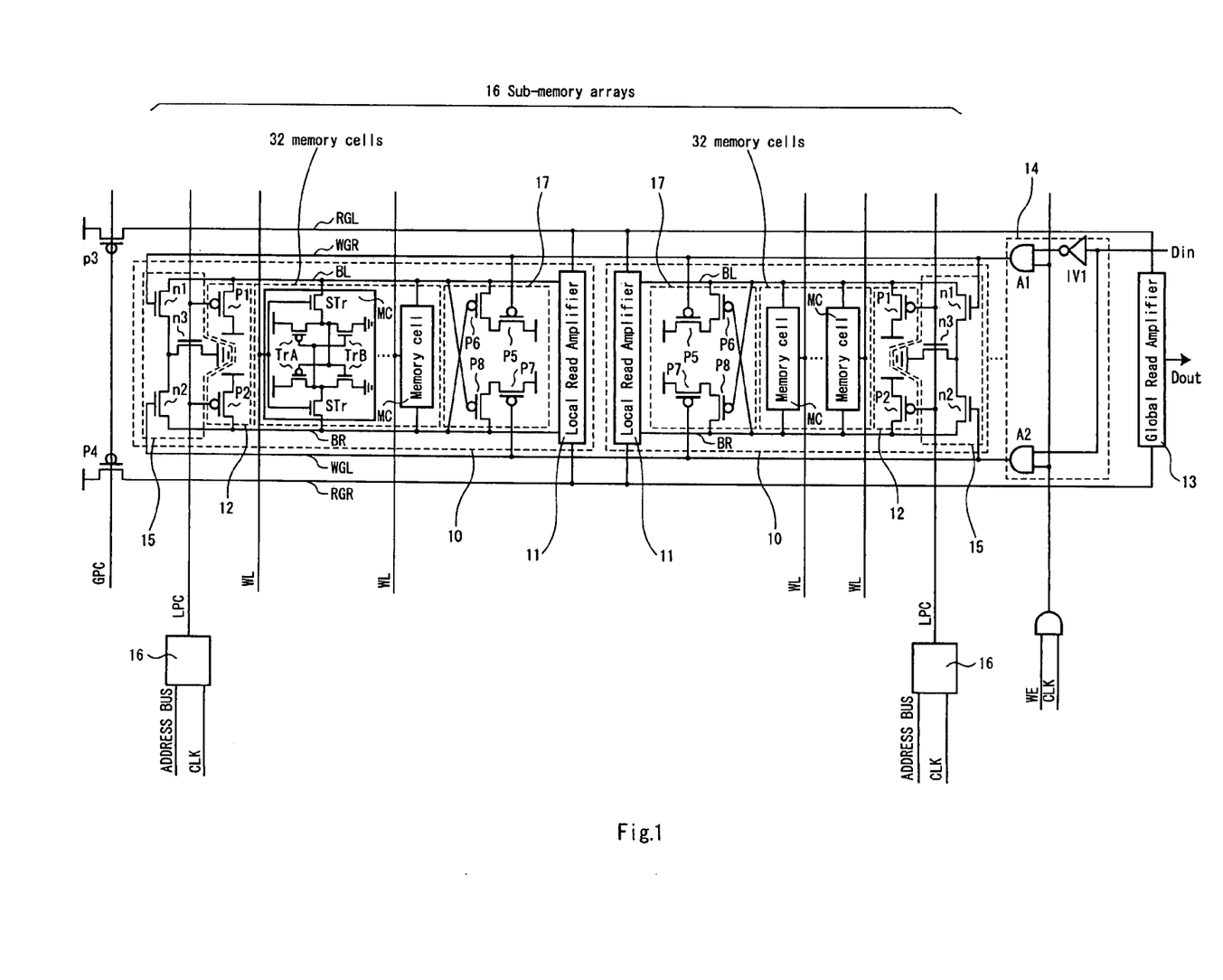
FIG. 1 is a circuit diagram of a Static Random Access Memory (SRAM) according to a first embodiment of the present invention.

FIG. 1 shows a circuit configuration of a Static Random Access Memory (hereinafter referred to as an "SRAM") according to a first embodiment of the present invention.

A plurality of memory cells are arranged in a matrix on a semiconductor substrate (not shown) and thereby constitute a memory array. Here, FIG. 1 illustratively shows a part of a memory array in one column to explain this embodiment. Each memory cell includes a flip-flop circuit FF having two n-channel transistors TrA and two p-channel transistors TrB, and two n-channel switching transistors STr.

On this semiconductor substrate, a plurality of word lines WL are provided in a row direction through an insulating layer, and a plurality of pairs of local bit lines BL and BR are provided in the column direction.

The memory array is divided into sub-memory arrays 10 each including group of memory cells MC (e.g., 32 memory cells MC), and group of sub-memory arrays 10 (e.g., 16 sub-memory arrays 10) are arranged in the column direction.

The sub-memory array 10 is disposed between and connected to a pair of local bit lines BL and BR. Accordingly, 16 pairs of local bit lines BL and BR are provided in one column. As compared to a conventional mode of connecting the entire memory array in one row to a pair of bit lines, only 32 memory cells MC are connected to a pair of local bit lines BL and BR when the memory array is divided into the sub-memory arrays 10. In this way, it is possible to reduce load capacities of the pair of local bit lines BL and BR.

Meanwhile, each pair of local bit lines BL and BR are respectively connected to two input terminals of a local read amplifier circuit 11 including a differential amplifier.

Moreover, the pair of local bit lines BL and BR are respectively connected to a precharge circuit 12. The precharge circuit includes a pair of p-channel transistors p1 and p2. Sources of the pair of p-channel transistors p1 and p2 are connected to a power source, gates thereof are connected to a precharge control signal line LPC for the local bit lines, and drains thereof are respectively connected to the pair of local bit lines BL and BR.

A pair of reading global bit lines RGL and RGR and a pair of writing global bit lines WGL and WGR extending in the column direction are provided in response to the 16 pairs of local bit lines BL and BR.

The pair of reading global bit lines RGL and RGR are connected to two input terminals of a global read amplifier circuit 13 including a differential amplifier circuit. An output terminal of this global amplifier circuit 13 is an output signal terminal Dout.

The pair of reading global bit lines RGL and RGR are connected to drains of a pair of p-channel transistors p3 and p4. The sources of p3 and p4 are connected to the power source, and their gates are connected to a precharge control signal line GPC for the global bit lines. Moreover, the pair of reading global bit lines RGL and RGR are connected to two output terminals of the local read amplifier circuits 11 provided for the respective sub-memory arrays 10.

The pair of writing global bit lines WGL and WGR are connected to two output terminals of a global write amplifier circuit 14. This global write amplifier circuit 14 includes one inverter circuit IV1 and two AND circuits (first and second AND circuits) A1 and A2.

An input signal terminal Din is connected to an input terminal of the inverter circuit IV1 and to one of input terminals of the second AND circuit A2. An output terminal of the inverter circuit IV1 is connected to one of input terminals of the first AND circuit A1. The rest of input terminals of the first and second AND circuits A1 and A2 are connected to a signal line where a write enable signal WE and a clock signal CLK are logically multiplied.

The pair of writing global bit lines WGL and WGR are connected to two data input terminals of each of the local write amplifier circuits 15. Two output terminals of this local write amplifier circuit 15 are connected to the pair of local bit lines BL and BR, and control input terminals thereof are connected to the precharge control signal line LPC for the local bit lines.

This local write amplifier circuit 15 includes three n-channel transistors (first to third n-channel transistors) n1, n2, and n3.

The pair of writing global bit lines WGL and WGR are respectively connected to gates of the first and second n-channel transistors n1 and n2. Moreover, drains of the first and second n-channel transistors n1 and n2 are respectively connected to the pair of local bit lines BL and BR. Sources of the first and second n-channel transistors n1 and n2 are connected to each other and then connected to a drain of the third n-channel transistor n3. A gate of the third n-channel transistor n3 is connected to the precharge control signal line LPC for the local bit lines, and a source thereof is grounded.

The precharge control signal line LPC for the local bit lines is connected to an output terminal of a decode circuit 16 which uses an address bus and the clock signal CLK as input signals. Therefore, a precharge control signal for the local bit lines is a signal obtained by decoding the address data and then synchronizing the decoded address data with the clock signal.

Moreover, each pair of local bit lines BL and BR are provided with a cross-coupled keeper transistor circuit 17. This cross-coupled keeper transistor circuit 17 includes four p-channel transistors (first to fourth p-channel transistors) p5, p6, p7, and p8. The cross-coupled keeper transistor circuit 17 is a data storage circuit for storing data of the pair of local bit lines BL and BR.

A source of the first p-channel transistor p5 is connected to the power source and a gate thereof is connected to one of the pair of writing global bit lines WGR. A drain of this first p-channel transistor p5 is connected to a source of the second p-channel transistor p6. A drain of the second p-channel transistor p6 is connected to one of the pair of local bit lines BL and a gate thereof is connected to the other one of the pair of local bit lines BR.

A source of the third p-channel transistor p7 is connected to the power source and a gate thereof is connected to the other one of the pair of writing global bit lines WGL. A drain of this third p-channel transistor p7 is connected to a source of the fourth p-channel transistor p8. A drain of the fourth p-channel transistor p8 is connected to one of the pair of local bit lines BR and a gate thereof is connected to the other one of the pair of local bit lines BL.

Figure 7A:
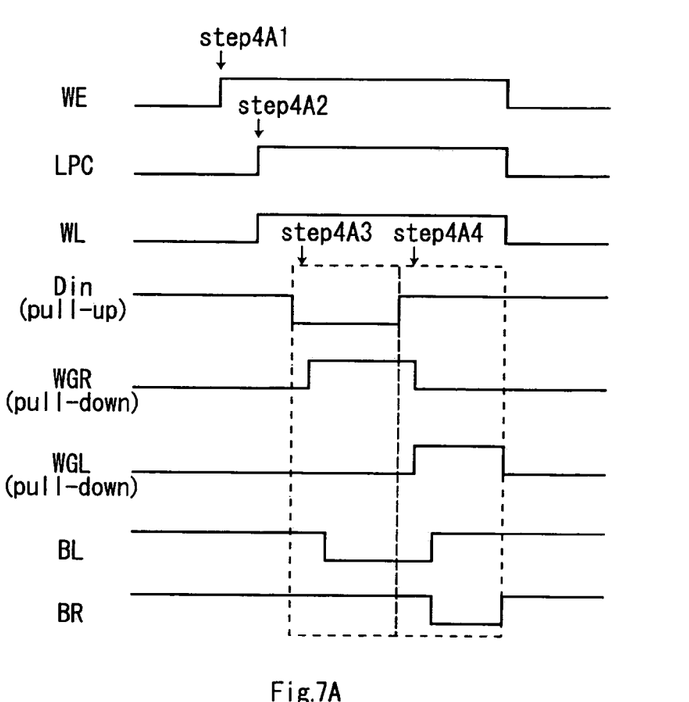
FIG. 7A represents a timing-chart for a write operation.

Next, an operation of writing data into a memory cell MC of the SRAM circuit shown in FIG. 1 will be described as shown a flow-chart in FIG. 4A and a timing-chart in FIG. 7A.

Figure 4A:
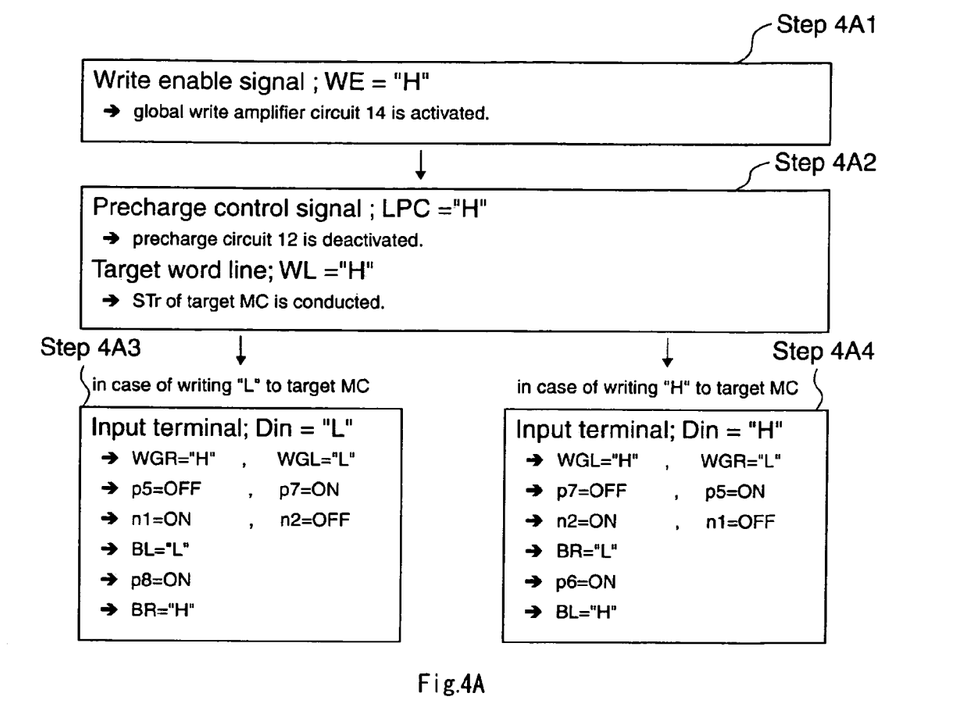
FIG. 4A represents a flow chart for a write operation.

Firstly, the write enable signal WE is set to a high (H) level and the H level is inputted to one of the input terminals of each of the first and second AND circuits A1 and A2 of the global write amplifier circuit 14, and the memory cell MC is set writable as shown in step 4A1 of FIG. 4A.

Next, when writing a low (L) level in the memory cell MC, a word line WL corresponding to the target memory cell MC is set to the H level and the switching transistor STr of the memory cell MC is activated as shown in step 4A2 of FIG. 4A. Meanwhile, the precharge control signal for the local bit lines is set to the H level (second polarity) by the decode circuit 16. The pair of p-channel transistors p1 and p2 of the precharge circuit 12 become non-conductive and the precharge circuit 12 is thereby deactivated.

Meanwhile, the source and the drain of the third n-channel transistor n3 of the local write amplifier circuit 15 are activated. The sources of the first and second n-channel transistors n1 and n2 are connected with the source of the third n-channel transistor n3 and are thereby pulled down. Accordingly, the local write amplifier circuit 15 is activated.

Then, the L level is inputted from the input signal terminal Din as shown in step 4A3 of FIG. 4A. One of the pair of writing global bit lines WGR is set to the H level by a logic circuit composed of the inverter circuit IV1 and the first AND circuit A1 of the global write amplifier circuit 14. On the contrary, the other one of the pair of writing global bit lines WGL is set to the L level by a logic circuit composed of the second AND circuit A2 of the global write amplifier circuit 14.

Therefore, the first n-channel transistor n1, having its gate connected to one of the pair of writing global bit lines WGR, is activated. On the contrary, the second n-channel transistor n2, having its gate connected to the other one of the pair of writing global bit lines WGL, remains inactive. Since the source of the first n-channel transistor n1 is pulled down, one of the pair of local bit lines BL is set to the L level. On the other hand, the other one of the pair of local bit lines BR maintains the H level because the second n-channel transistor n2 is deactivated. Therefore, the L level is written in the flip-flop circuit FF of the memory cell MC.

The local bit lines BL and BR are not precharged when writing the data to the memory cell. Therefore, as described above, it is possible to control the precharge circuit 12 and the local write amplifier circuit 15 with a signal precharge control signal line LPC.

Here, an operation of the cross-coupled keeper transistor circuit 17 is as follows. Since one of the pair of writing global bit lines WGR is set to the H level, the first p-channel transistor p5 is deactivated. On the other hand, since the other one of the pair of writing global bit lines WGL is set to the L level, the third p-channel transistor p7 is activated and the source of the fourth p-channel transistor p8 is pulled up.

Here, the first n-channel transistor n1 is activated and one of the pair of local bit lines BL is set to the L level. Accordingly, the fourth p-channel transistor p8 is activated and the other one of the pair of local bit lines BR is pulled up. Meanwhile, since the other one of the pair of local bit lines BR is set to the H level, the second p-channel transistor p6 remains inactive. Therefore, the cross-coupled keeper transistor circuit 17 serves for maintaining the H level at the other one of the pair of local bit lines BR.

Next, when writing the H level to the memory cell MC, as similar to the above-described case of writing the L level, the write enable signal WE is set to the H level as shown in step 4A2 of FIG. 4A and the H level is inputted to one of the input terminals of each of the first and second AND circuits A1 and A2 of the global write amplifier circuit 14, and the memory cell MC is set writable.

Next, the word line WL corresponding to the target memory cell MC is set to the H level and the switching transistor STr of the memory cell MC is activated. Meanwhile, the precharge control signal for the local bit lines is set to the H level (second polarity) by the decode circuit 16. The pair of p-channel transistors p1 and p2 of the precharge circuit 12 become non-conductive and the precharge circuit 12 is thereby deactivated. Meanwhile, the third n-channel transistor n3 of the local write amplifier circuit 15 is activated. The sources of the first and second n-channel transistors n1 and n2 are connected with the source of the third n-channel transistor n3 and are thereby pulled down. Accordingly, the local write amplifier circuit 15 is activated.

Then, the H level is inputted from the input signal terminal Din as shown in step 4A4 of FIG. 4A. One of the pair of writing global bit lines WGR is set to the L level by the logic circuit composed of the inverter circuit IV1 and the first AND circuit A1 of the global write amplifier circuit 14. In the meantime, when the H level is inputted from the input signal terminal Din, the other one of the pair of writing global bit lines WGL is set to the H level by the logic circuit composed of the second AND circuit A2 of the global write amplifier circuit 14.

Therefore, the first n-channel transistor n1, having its gate connected to one of the pair of writing global bit lines WGR, is deactivated. On the contrary, the second n-channel transistor n2, having its gate connected to the other one of the pair of writing global bit lines WGL, is activated. Since the source of the second n-channel transistor n2 is pulled down, one of the pair of local bit lines BR is set to the L level. On the other hand, the other one of the pair of local bit lines BL maintains the H level because the first n-channel transistor n1 is deactivated. Therefore, the H level is written in the flip-flop circuit FF of the memory cell MC.

Here, an operation of the cross-coupled keeper transistor circuit 17 is as follows. Since the other one of the pair of writing global bit lines WGL is set to the H level, the third p-channel transistor p7 is deactivated. On the other hand, since the one of the pair of writing global bit lines WGR is set to the L level, the first p-channel transistor p5 is activated and the source of the second p-channel transistor p6 is pulled up.

Since the second n-channel transistor n2 of the local write amplifier circuit 15 is activated and one of the pair of local bit lines BR is set to the L level, the second p-channel transistor p6 is activated and the other one of the pair of local bit lines BL is pulled up. Meanwhile, since the other one of the pair of local bit lines BL is set to the H level, the fourth p-channel transistor p8 is deactivated. Therefore, the cross-coupled keeper transistor circuit 17 can maintain the H level at the other one of the pair of local bit lines BL.

In this way, control to connect the power source to the sources of the second and fourth p-channel transistors p6 and p8 for pulling up the local bit lines BL and BR is performed by the first and third p-channel transistors p5 and p7. The first and third p-channel transistors p5 and p7 are respectively controlled by the pair of writing global bit lines WGL and WGR. For example, even when writing different data from the data stored in the memory cell, connection of the power source to the sources of the first and third p-channel transistors p5 and p7 is controlled by the writing global bit lines WGL and WGR before new data are transmitted to the local bit lines BL and BR. Accordingly, the data do not conflict on the local bit lines BL and BR.

Figure 4B:
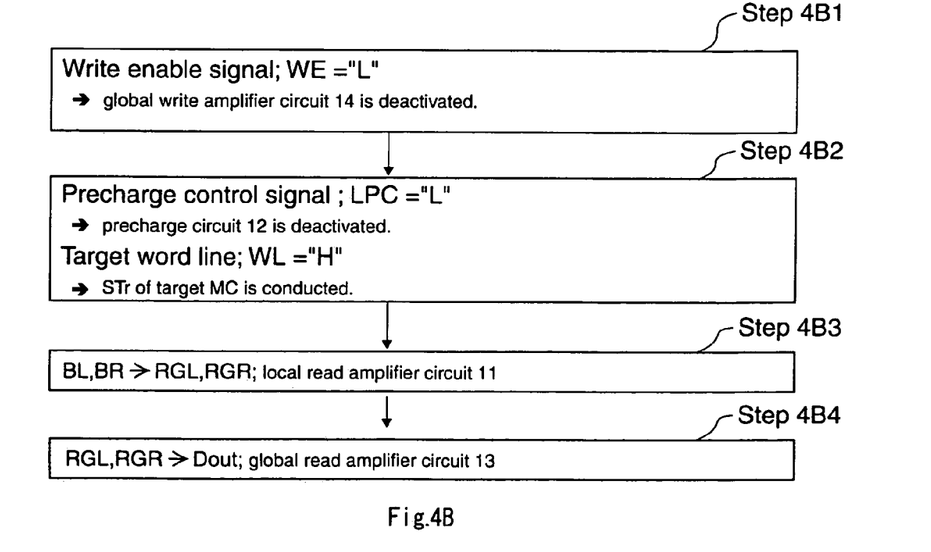
FIG. 4B represents a flow chart for a read operation.
Figure 7B:
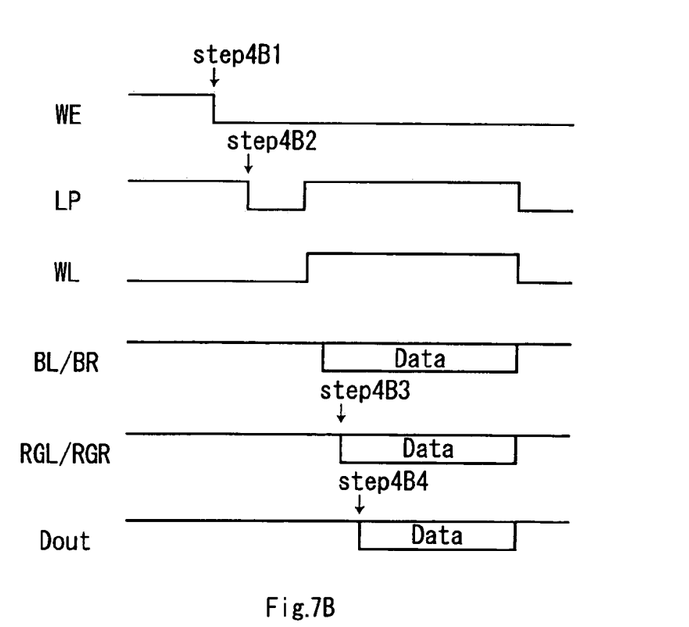
FIG. 7B represents a timing-chart for a read operation.

Next, an operation of reading the data stored in a flip-flop circuit FF of a memory cell MC is as shown a flow-chart in FIG. 4B and a timing-chart in FIG. 7B.

First, the write enable signal WE is set to the L level as shown in step 4B1 of FIG. 4B. Therefore, the L level is inputted to one of input terminals of each of the first and second AND circuits A1 and A2 of the global write amplifier circuit 14 and a writing operation is thereby inhibited.

Then, the precharge control signal for the local bit lines is set to the L level (first polarity) by the decode circuit 16, and the pair of p-channel transistors p1 and p2 of the precharge circuit 12 are activated so as to activate the precharge circuit 12 as shown in step 4B2 of FIG. 4B. The pair of local bit lines BL and BR are pulled up before reading.

Thereafter, the precharge control signal is set to the H level (second polarity). After deactivating the precharge circuit 12, the word line WL corresponding to the target memory cell MC is set to the H level and the switching transistor STr of the memory cell MC is activated. Accordingly, it is possible to read the data stored in the flip-flop circuit FF out to the pair of local bit lines BL and BR by means of conducting the flip-flop circuit FF in the memory cell MC to the pair of local bit lines BL and BR. Here, the local write amplifier circuit 15 is activated when the precharge circuit 12 is deactivated. However, the global write amplifier circuit 14 remains deactivated so that the data are not written to the memory cell MC.

Next, the data read out to the pair of local bit lines BL and BR are amplified by the differential amplifier in the local read amplifier circuit 11 and are transmitted to the pair of reading global bit lines RGL and RGR as shown in step 4B3 of FIG. 4B.

The amplified data are further amplified to full amplitude by the differential amplifier in the global read amplifier circuit 13, and the amplified data stored in the memory cell MC are outputted from the output signal terminal Dout as shown in step 4B4 of FIG. 4B.

In this way, since the precharge to the local bit lines and data writing in the memory cell do not take place concurrently, it is possible to control the precharge circuit 12 and the local write amplifier circuit 15 with the single precharge control signal line LPC. In the related art, for each sub-memory array 10, the precharge control signal line LPC has been conventionally used for the precharge circuit 12, two control lines of the write enable signal line WE for the local write amplifier circuit 15. However, according to this embodiment, it is possible to reduce the number of the control signal lines and to downsize a circuit area of the semiconductor memory device.

Moreover, since only three n-channel transistors n1, n2 and n3 are necessary for the local write amplifier circuit 15 of this embodiment, it is possible to downsize the local write amplifier circuit 15 as compared to the related art.

(Second Embodiment)

Figure 2:
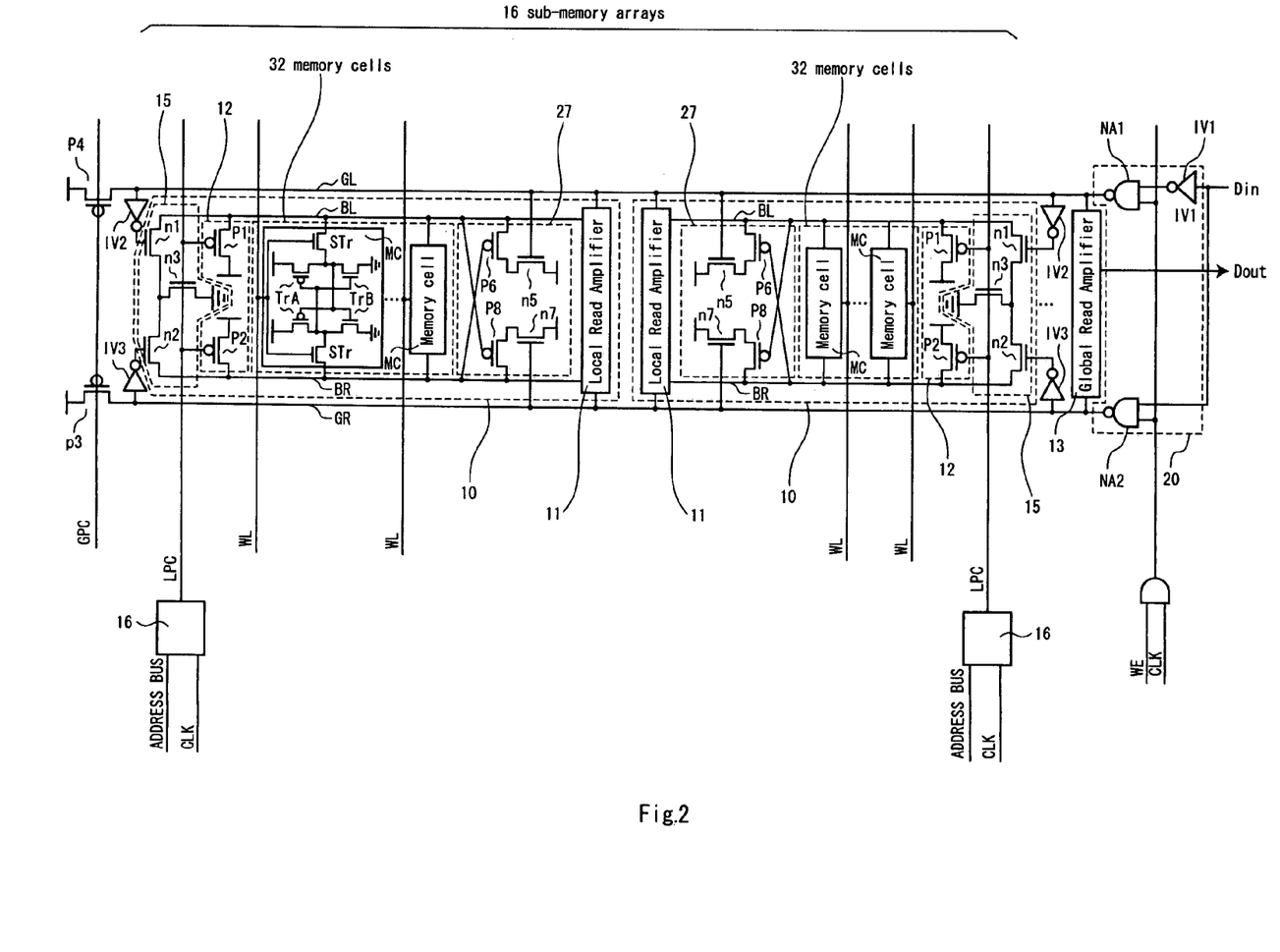
FIG. 2 is a circuit diagram of an SRAM according to a second embodiment of the present invention.

Next, FIG. 2 shows a circuit configuration of an SRAM according to a second embodiment of the SRAM according to the present invention. The second embodiment is a modified example of the first embodiment. In the second embodiment, the reading global bit lines RGL and RGR are combined with the writing global bit lines WGL and WGR to form a single pair of global bit lines GL and GR.

Similar to the first embodiment, a plurality of memory cells are arranged in a matrix on a semiconductor substrate (not shown) and thereby constitute a memory array. Here, FIG. 2 illustratively shows a part of a memory array in one column to explain this embodiment. In the following, the same constituents as those in the first embodiment are designated by the same reference numerals and description thereof will be omitted.

A pair of global bit lines GL and GR extending in the column direction are provided for each group of pairs (e.g, 16 pairs) of local bit lines BL and BR.

The pair of global bit lines GL and GR are connected to drains of a pair of p-channel transistors p3 and p4. The sources of p3 and p4 are connected to a power source, and their gates are connected to a precharge control signal line GPC for the global bit lines. Moreover, the pair of global bit lines GL and GR are connected to two output terminals of the local read amplifier circuits 11 provided for respective sub-memory arrays 10. The local read amplifier circuit 11 includes a differential amplifier. Furthermore, the pair of global bit lines GL and GR are connected to two input terminals of a global read amplifier circuit 13 and to two output terminals of a global write amplifier 20.

In addition, the pair of global bit lines GL and GR are connected to gates of first and second n-channel transistors n1 and n2 of each local write amplifier circuit 15 through a pair of inverter circuits IV2 and IV3.

Also connected to the pair of global bit lines GL and GR is a cross-coupled keeper transistor circuit 27 (including n-type transistor n5 and n7) for each local read amplifier 11.

Here, the global write amplifier circuit 20 includes one inverter circuit IV1 and two NAND circuits (first and second NAND circuits) NA1 and NA2.

The rest of the circuit configuration is similar to the SRAM circuit according to the above-described first embodiment shown in FIG. 1.

Figure 8A:
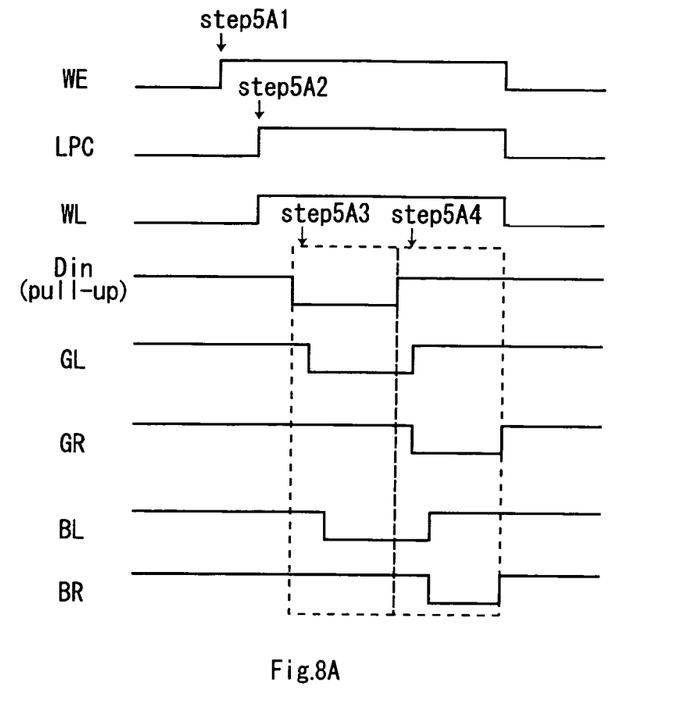
FIG. 8A represents a timing-chart for a write operation.

Next, an operation of writing data at an L level to a memory cell MC of the SRAM circuit shown in FIG. 2 will be described as shown a flow-chart in FIG. 5A and a timig-chart in FIG. 8A.

Figure 5A:
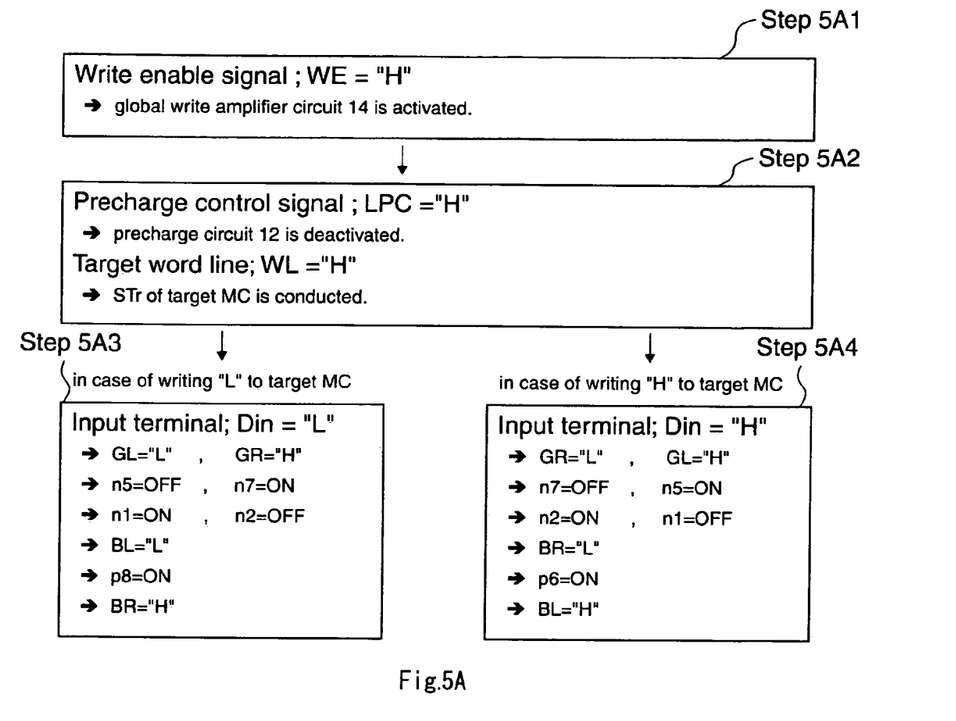
FIG. 5A represents a flow chart for a write operation.

Firstly, a write enable signal WE is set to an H level and the H level is inputted to one of input terminals of each of the first and second NAND circuits NA1 and NA2 of the global write amplifier circuit 20, and the memory cell MC is set writable as shown in step 5A1 of FIG. 5A.

Next, a word line WL corresponding to the target memory cell MC is set to the H level and a switching transistor STr of the memory cell MC is activated as shown in step 5A2 of FIG. 5A. Meanwhile, a precharge control signal for the local bit lines is set to the H level (second polarity) by a decode circuit 16. A pair of p-channel transistors p1 and p2 of a precharge circuit 12 become non-conductive and the precharge circuit 12 is thereby deactivated. In the meantime, a third n-channel transistor n3 of the local write amplifier circuit 15 is activated. Sources of the first and second n-channel transistors n1 and n2 are connected to a source of the third n-channel transistor n3 and are thereby pulled down. Accordingly, the local write amplifier circuit 15 is activated.

Then, the L level is inputted from an input signal terminal Din as shown in step 5A3 of FIG. 5A. One of the pair of global bit lines GL is set to the L level by a logic circuit composed of the inverter circuit IV1 and the first NAND circuit NA1 of the global write amplifier circuit 20. This one of the pair of global bit lines GL is converted to the H level by one of the inverter circuits IV2, and the H level is inputted to the gate of the first n-channel transistor n1 of the local write amplifier circuit 15.

On the contrary, the other one of the pair of global bit lines GR is set to the H level by a logic circuit composed of the second NAND circuit NA2. The other one of the pair of global bit lines GR is converted to the L level by the other one of the inverter circuits IV3, and the L level is inputted to the gate of the second n-channel transistor n2 of the local write amplifier circuit 15.

Therefore, the first n-channel transistor n1 of the local write amplifier circuit 15, having its gate connected to one of the pair of global bit lines GL, is activated. On the contrary, the second n-channel transistor n2 of the local write amplifier circuit 15, having its gate connected to the other one of the pair of global bit lines GR, remains inactive. As a result, since the source of the first n-channel transistor n1 is pulled down, one of the pair of local bit lines BL is set to the L level. On the contrary, the other one of the pair of local bit lines BR maintains the H level because the second n-channel transistor n2 is deactivated. Therefore, the L level is written in a flip-flop circuit FF of the memory cell MC.

The local bit lines are not precharged when writing the data to the memory cell. Therefore, as described above, it is possible to control the precharge circuit 12 and the local write amplifier circuit 15 with the signal precharge control signal line LPC.

Here, an operation of the cross-coupled keeper transistor circuit 27 is as follows. Since the one of the pair of writing global bit lines GL is set to the L level, the fourth n-channel transistor n5 is deactivated. On the other hand, since the other one of the pair of global bit lines GR is set to the H level, the fifth n-channel transistor n7 is activated and the source of the fourth p-channel transistor p8 is pulled up.

Since the first n-channel transistor n1 of the local write amplifier circuit 15 is activated and one of the pair of local bit lines BL is set to the L level, the fourth p-channel transistor p8 is activated and the other one of the pair of local bit lines BR is pulled up. Meanwhile, since the other one of the pair of local bit lines BR is set to the H level, the second p-channel transistor p6 is deactivated. Therefore, the cross-coupled keeper transistor circuit 27 can maintain the H level at the other one of the pair of local bit lines BR.

In this way, control to connect the power source to the sources of the second and fourth p-channel transistors p6 and p8 for pulling up the local bit lines BL and BR is performed by the fourth and fifth n-channel transistors n5 and n7. The fourth and fifth n-channel transistors n5 and n7 are respectively controlled by the pair of global bit lines GL and GR. For example, even when writing different data from the data stored in the memory cell, connection of the power source to the sources of the fourth and fifth n-channel transistors n5 and n7 is controlled by the global bit lines GL and GR before new data are transmitted to the local bit lines BL and BR. Accordingly, the data do not conflict on the local bit lines BL and BR.

Figure 5B:
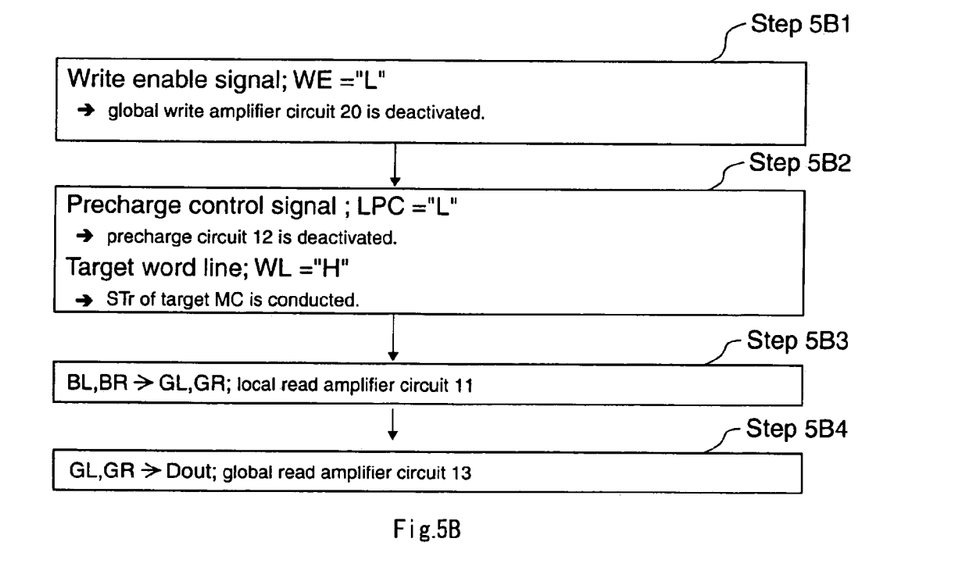
FIG. 5B represents a flow chart for a read operation.
Figure 8B:
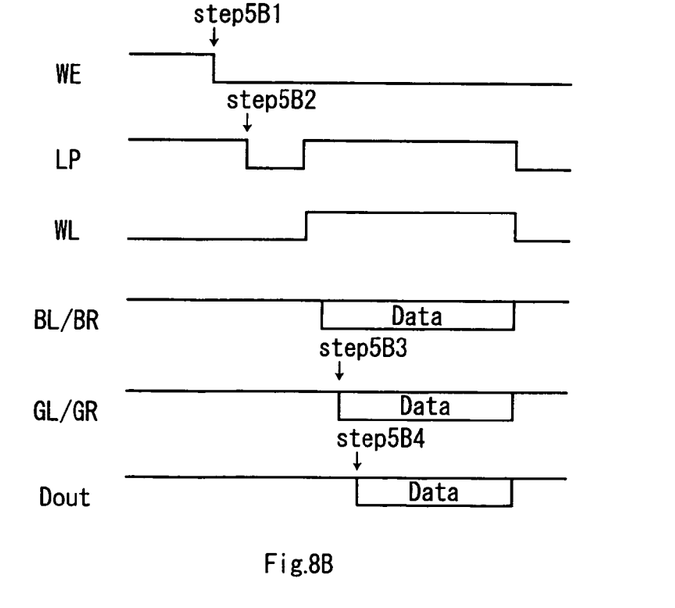
FIG. 8B represents a timing-chart for a read operation.

Next, an operation of reading the data stored in a flip-flop circuit FF of a memory cell MC is as shown a flow-chart in FIG. 5B and a timing-chart in FIG. 8B.

First, the write enable signal WE is set to the L level as shown in step 5B1 of FIG. 5B. Therefore, the L level is inputted to one of input terminals of each of the first and second NAND circuits NA1 and NA2 of the global write amplifier circuit 20 and this global write amplifier circuit 20 is thereby deactivated.

Then, the precharge control signal for the local bit lines is set to the L level (first polarity) by the decode circuit 16 as shown in step 5B2 of FIG. 5B. The pair of p-channel transistors p1 and p2 of the precharge circuit 12 are activated so as to activate the precharge circuit 12. The pair of local bit lines BL and BR are pulled up before reading.

Thereafter, the precharge control signal is set to the H level (second polarity). After deactivating the precharge circuit 12, the word line WL corresponding to the target memory cell MC is set to the H level and the switching transistor STr of the memory cell MC is activated. Accordingly, it is possible to read the data stored in the flip-flop circuit FF out to the pair of local bit lines BL and BR by means of conducting the flip-flop circuit FF in the memory cell MC with the pair of local bit lines BL and BR. Here, the local write amplifier circuit 15 is activated when the precharge circuit 12 is deactivated. However, the global write amplifier circuit 20 is deactivated so that the data are not written to the memory cell MC.

Next, the data read out to the pair of local bit lines BL and BR are amplified by the differential amplifier in the local read amplifier circuit 11 and are transmitted to the pair of global bit lines GL and GR as shown in step 5B3 of FIG. 5B.

The amplified data are further amplified to full amplitude by a differential amplifier in the global read amplifier circuit 13, and the data stored in the memory cell MC are outputted from an output signal terminal Dout as shown in step 5B4 of FIG. 5B.

In this way, since the precharge to the local bit lines and data writing in the memory cell do not take place concurrently, it is possible to control the precharge circuit 12 and the local write amplifier circuit 15 with a single precharge control signal line LPC. In the related art, the precharge control signal line LPC has been conventionally used for the precharge circuit 12, and two control lines of the write enable signal line WE for the local write amplifier circuit 15. According to this embodiment, it is possible to reduce the number of the control signal lines and to downsize a circuit area of the semiconductor memory device.

Moreover, since only three n-channel transistors n1, n2 and n3 are necessary for the local write amplifier circuit 15 of this embodiment, it is possible to downsize the local write amplifier circuit 15 as compared to the related art.

Furthermore, since the global bit lines are used for both reading and writing in this embodiment, each column requires only a pair of (i.e. two) global bit lines. Accordingly, it is possible to further downsize the circuit area as compared to the first embodiment.

(Third Embodiment)

Figure 3:
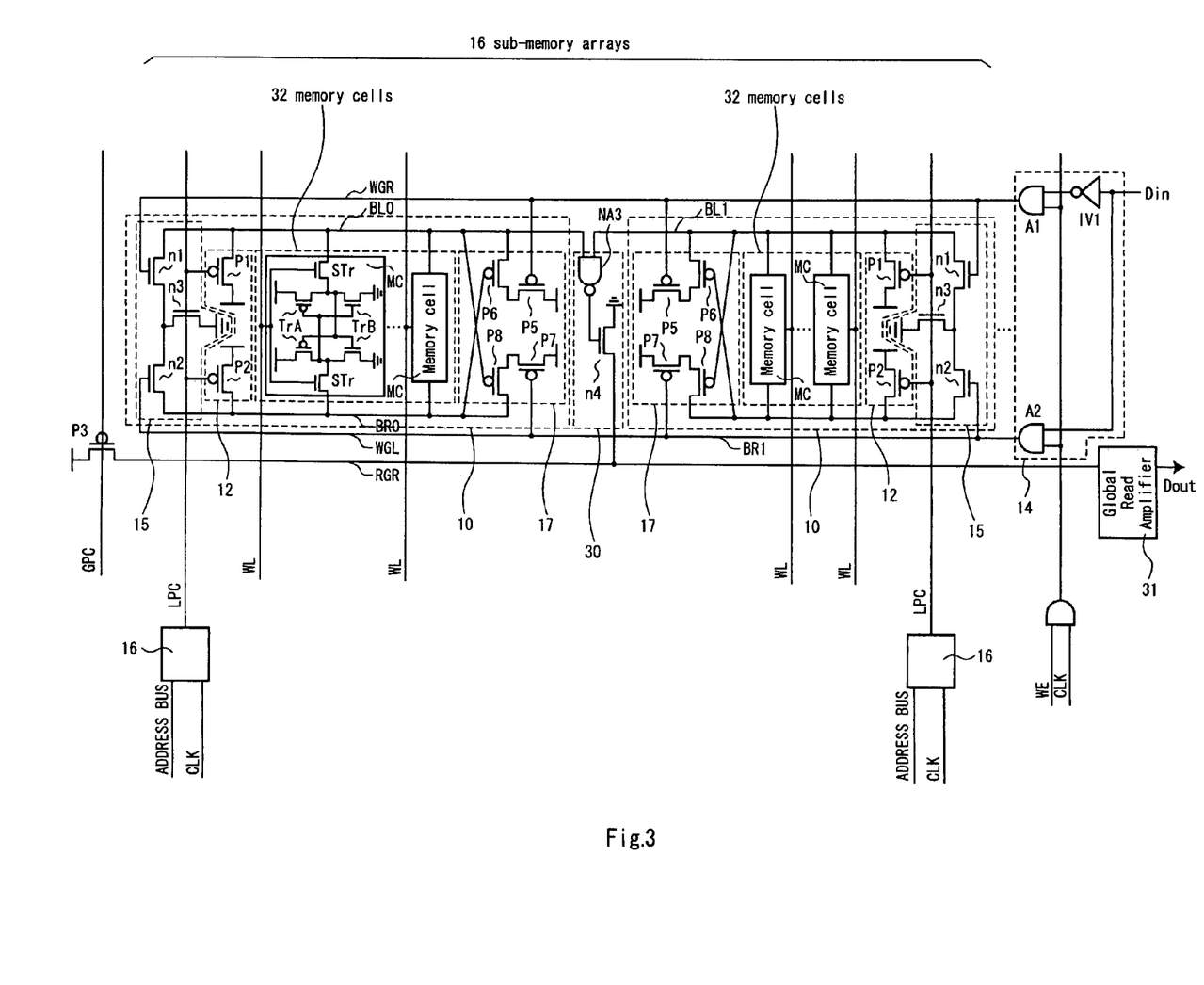
FIG. 3 is a circuit diagram of an SRAM according to a third embodiment of the present invention.

Next, FIG. 3 shows a circuit configuration of an SRAM according to a third embodiment of the present invention. The third embodiment is a modified example of the first embodiment. In the third embodiment, a single-end read sense amplifier is used in a local read amplifier circuit instead of a differential amplifier.

As similar to the first embodiment, a plurality of memory cells are arranged in a matrix on a semiconductor substrate (not shown) and thereby constitute memory arrays. Here, FIG. 3 illustratively shows a part of a memory array in one column to explain this embodiment. In the following, the same portions as those in the first embodiment are designated by the same reference numerals and description thereof will be omitted.

A reading global bit line RGL and a pair of writing global bit lines WGL and WGR extending in the column direction are provided for each group of pairs (e.g., 16 pairs) of local bit lines BL and BR.

Meanwhile, in a local read amplifier circuit 30, first and second input terminals are respectively connected to one of the line BL0 of a first pair of local bit line and one of the line BL1 of a second pair of local bit line, and an output terminal thereof is connected to a reading global bit line RGL.

The local read amplifier circuit 30 includes one NAND circuit NA3 and one n-channel transistor n4. First and second input terminals of the NAND circuit NA3 are respectively connected to one of the lines BL0 of the first pair of local bit line and one of the line BL1 of the second pair of local bit line, and an output terminal thereof is connected to a gate of the n-channel transistor n4. Moreover, a source of the n-channel transistor n4 is grounded and a drain thereof is connected to the reading global bit line RGL.

The reading global bit line RGL is connected to an input terminal of a read amplifier circuit 31 including a buffer circuit, and data in memory cells MC are read out from an output signal terminal Dout of this global read amplifier circuit 31.

An operation of writing data into a memory cell MC of the SRAM circuit of this embodiment shown in FIG. 3 is identical to that shown in FIG. 1 concerning the above-described first embodiment. Accordingly, description on the operation will be omitted.

Figure 6:
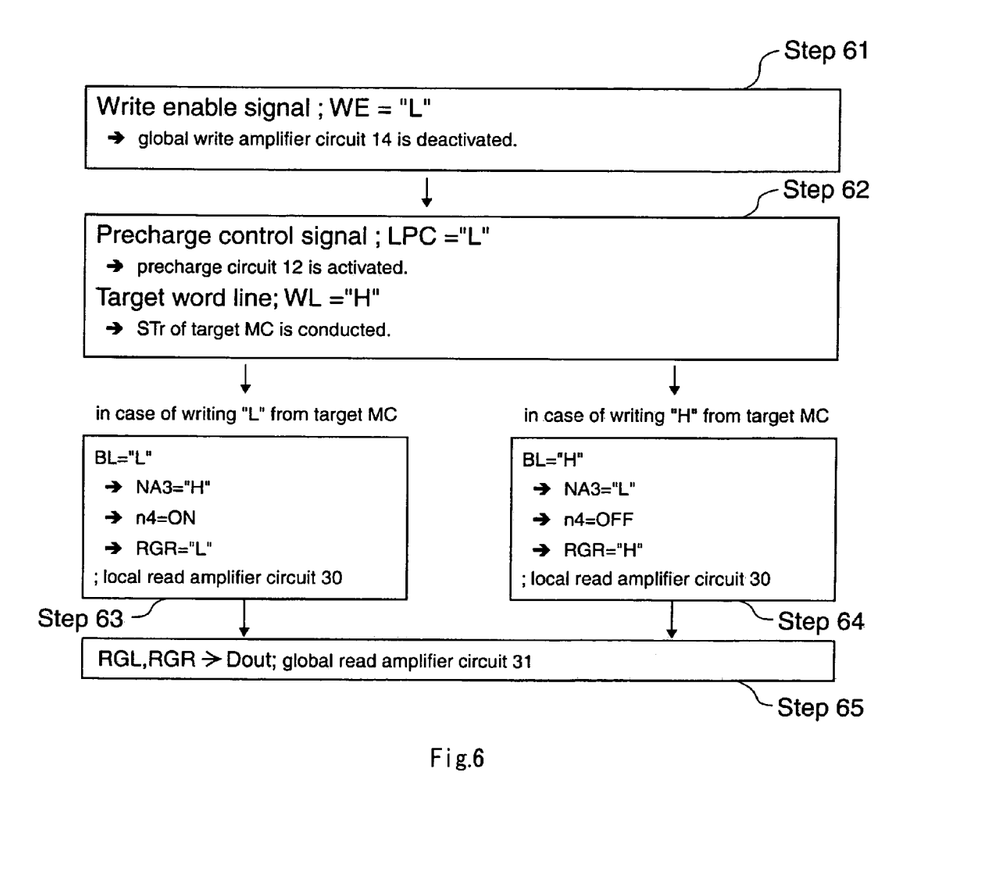
FIG. 6 is a flow chart corresponding to the circuit of FIG. 3 and represents a flow chart for a read operation.
Figure 9:
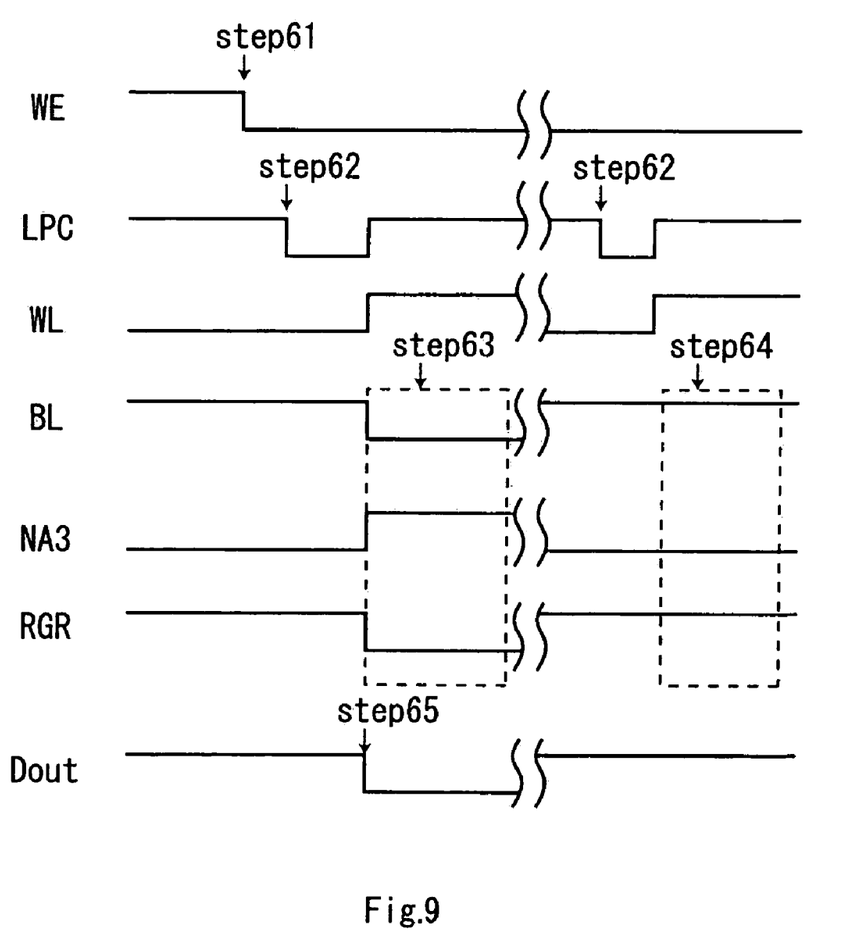
FIG. 9 represents a timing-chart for a read operation corresponding to the circuit of FIG. 3.

An operation of reading the data stored in a flip-flop circuit FF of a memory cell MC is as shown a flow-chart in FIG. 6 and a timing-chart in FIG. 9.

Firstly, a write enable signal WE is set to an L level as shown in step 61 of FIG. 6. Therefore, the L level is inputted to one of input terminals of each of first and second AND circuits A1 and A2 of a global write amplifier circuit 14 and this global write amplifier circuit 14 is thereby deactivated.

Then, a precharge control signal for the local bit lines is set to the L level (first polarity) by the decode circuit 16. Accordingly, a pair of p-channel transistors p1 and p2 of a precharge circuit 12 are activated so as to activate the precharge circuit 12 as shown in step 62 of FIG. 6. The pair of local bit lines BL and BR are pulled up before reading.

Next, the precharge control signal is set to the H level (second polarity) to deactivate the precharge circuit 12. Thereafter, a word line WL corresponding to the target memory cell MC is set to the H level and a switching transistor STr of the memory cell MC is activated. Accordingly, it is possible to read the data stored in the flip-flop circuit FF out to one of the pair of local bit lines BL by means of connecting the flip-flop circuit FF in the memory cell MC with the pair of local bit lines BL and BR. Here, the local write amplifier circuit 15 is activated when the precharge circuit 12 is deactivated. However, the global write amplifier circuit 20 is deactivated so that the data are not rewritten (overwritten) to the memory cell MC.

Thereafter, the data read out to one of the pair of local bit lines, BL are amplified to approximately full amplitude by the local read amplifier circuit 30.

When the data stored in the flip-flop circuit FF of the memory cell MC are at the L level, the L level is inputted to the NAND circuit NA3 of the local read amplifier circuit 30. Accordingly, an output of the NAND circuit NA3 of the local read amplifier circuit 30 is set to the H level as shown in step 63 of FIG. 6. Since the H level is inputted to the gate of the n-channel transistor n4, the n-channel transistor n4 is set to an on state. Since the reading global bit line RGL is grounded by the n-channel transistor n4 set to the on state, it is possible to read the L level from the output signal terminal Dout as shown in step 65 of FIG. 6.

On the contrary, when the data stored in the flip-flop circuit FF of the memory cell MC are at the H level, the output of the NAND circuit NA3 of the local read amplifier circuit 30 is set to the L level as shown in step 64 of FIG. 6. Since the L level is inputted to the gate of the n-channel transistor n4, the n-channel transistor n4 is set to an off state. Since the reading global bit line RGL is charged by a pair of p-channel transistors p3 and p4 for the global bit line before reading, it is possible to read an H-level signal, which is obtained by inputting the H level to the global read amplifier circuit 31 and amplifying the H level to the full amplitude, out of the output signal terminal Dout as shown in step 65 of FIG. 6.

In this way, by using the fact that the precharge to the local bit lines and data writing to the memory cell do not take place concurrently, it is possible to control the precharge circuit 12 and the local write amplifier circuit 15 with a single precharge control signal line LPC. In the related art, for each sub-memory array 10, the precharge control signal line LPC has been conventionally used for the precharge circuit 12, and two control lines of a write enable signal line WE for the local write amplifier circuit 15. According to this embodiment, it is possible to reduce the number of the control signal lines and to downsize a circuit area of the semiconductor memory device.

Moreover, since only three n-channel transistors n1, n2 and n3 are necessary for the local write amplifier circuit 15 of this embodiment, it is possible to downsize the local write amplifier circuit 15 as compared to the related art.

In addition, since the local read amplifier circuit 30 can be formed only of a simple logic circuit, it is possible to significantly downsize an area occupied by the circuit as compared to a differential amplifier. Moreover, since the readout data can be amplified to the full amplitude, it is not necessary to sense small amplitudes or to consider manufacturing variations. Furthermore, the single local read amplifier 30 can be used in common when reading a plurality of local bit lines 10. Accordingly, it is possible to further downsize the area.

The above-described first to third embodiments are only examples for describing the embodiments of the present invention.

Although each sub-memory array includes 32 memory cells and 16 sub-memory arrays are arranged in the embodiments, the number of division of the memory array or the number of arrangement of the sub-memory arrays is not limited to the embodiments.

Meanwhile, generation of the precharge control signals for the local bit lines or the control signals for the global write amplifier circuits 14 and 20 are not limited to the first to third embodiments.

Moreover, the global bit lines may be formed on a different wiring layer from the local bit lines or on the same wiring layer.

Furthermore, the memory cell is not limited to include 6 transistors. Instead, the memory cell may include a flip-flop circuit formed of two resistors and two transistors in which the pair of transistors are crisscrossed.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor memory device comprising:
a plurality of word lines extending in a row direction;
a plurality of pairs of local bit lines extending in a column direction;
a plurality of memory cells respectively arranged in row and column directions, the memory cells being connected to the word line on every row and connected to the pair of local bit lines on every column;
a pair of global bit lines extending in the column direction and corresponding to the plurality of pairs of local bit lines;
a plurality of precharge circuits each including an input terminal being connected to a control signal line and an output terminal being connected to the plurality of pairs of local bit lines, the precharge circuits being activated during a period when the control signal line is set to a first polarity; and
a plurality of local write amplifier circuits each including a data input terminal being connected to the pair of global bit lines, a control input terminal being connected to the control signal line, and an output terminal being connected to the plurality of pairs of local bit lines, the local write amplifier circuits being activated during a period when the control signal line is set to a second polarity,
wherein the pair of global bit lines comprises:
a first pair of global bit lines and a second pair of global bit lines extending in the column direction and corresponding to the pair of local bit lines,
wherein the plurality of local write amplifier circuits each including a data input terminal being connected to the first pair of global bit lines, a control input terminal being connected to the control signal line, and an output terminal being connected to the plurality of pairs of local bit lines, the local write amplifier circuits being activated during a period when the control signal line is set to a second polarity, and
wherein the semiconductor memory device further comprises:
a plurality of local read amplifier circuits each including an input terminal being connected to the plurality of pairs of local bit lines and an output terminal being connected to the second pair of global bit lines;
a global write amplifier circuit including an input terminal being connected to a data input signal line and an output terminal being connected to the first pair of global bit lines; and
a global read amplifier circuit including an input terminal being connected to the second pair of global bit lines and an output terminal being connected to a data output signal line.

2. A semiconductor memory device comprising:
a plurality of word lines extending in a row direction;
a plurality of pairs of local bit lines extending in a column direction;
a plurality of memory cells respectively arranged in row and column directions, the memory cells being connected to the word line on every row and connected to the pair of local bit lines on every column;
a pair of global bit lines extending in the column direction and corresponding to the plurality of pairs of local bit lines;
a plurality of precharge circuits each including an input terminal being connected to a control signal line and an output terminal being connected to the plurality of pairs of local bit lines, the precharge circuits being activated during a period when the control signal line is set to a first polarity;
a plurality of local write amplifier circuits each including a data input terminal being connected to the pair of global bit lines, a control input terminal being connected to the control signal line, and an output terminal being connected to the plurality of pairs of local bit lines, the local write amplifier circuits being activated during a period when the control signal line is set to a second polarity;
a plurality of local read amplifier circuits each including an input terminal being connected to the plurality of pairs of local bit lines and an output terminal being connected to the pair of global bit lines;
a global write amplifier circuit including an input terminal being connected to a data input signal line and an output terminal being connected to the pair of global bit lines; and
a global read amplifier circuit including an input terminal being connected to the pair of global bit lines and an output terminal being connected to a data output signal line.

3. A semiconductor memory device comprising:
a plurality of word lines extending in a row direction;
a plurality of pairs of local bit lines extending in a column direction;
a plurality of memory cells respectively arranged in row and column directions, the memory cells being connected to the word line on every row and connected to the pair of local bit lines on every column;
a pair of global bit lines extending in the column direction and corresponding to the plurality of pairs of local bit lines;
a plurality of precharge circuits each including an input terminal being connected to a control signal line and an output terminal being connected to the plurality of pairs of local bit lines, the precharge circuits being activated during a period when the control signal line is set to a first polarity; and
a plurality of local write amplifier circuits each including a data input terminal being connected to the pair of global bit lines, a control input terminal being connected to the control signal line, and an output terminal being connected to the plurality of pairs of local bit lines, the local write amplifier circuits being activated during a period when the control signal line is set to a second polarity,
wherein the pair of global bit lines comprising a first pair of global bit lines and a second pair of global bit lines extending in the column direction and corresponding to the pair of local bit lines,
wherein the plurality of local write amplifier circuits each including a data input terminal being connected to the first pair of global bit lines, a control input terminal being connected to the control signal line, and an output terminal being connected to the plurality of pairs of local bit lines, the local write amplifier circuits being activated during a period when the control signal line is set to a second polarity, and wherein the semiconductor memory device further comprises:
a local read amplifier circuit including an input terminal being respectively connected to the plurality of pairs of local bit lines and an output terminal being connected to the second pair of global bit lines; and
a global write amplifier circuit including an input terminal being connected to a data input signal line and an output terminal being connected to the first pair of global bit lines.

4. A semiconductor memory device comprising:
a memory array including a plurality of memory cells;
a plurality of word lines corresponding to the respective memory cells;
a pair of local bit lines corresponding to the memory array;
a pair of global bit lines corresponding to the pair of local bit lines;
a precharge circuit including an output terminal being connected to the pair of local bit lines;
a local write amplifier circuit including a data input terminal being connected to the pair of global bit lines and an output terminal being connected to the pair of local bit lines; and
a control signal line being connected to an input terminal of the precharge circuit and to a control input terminal of the local write amplifier circuit,
wherein the local write amplifier circuit is deactivated by the control signal line when the precharge circuit is activated, and
the precharge circuit is deactivated by the control signal line when the local write amplifier circuit is activated,
wherein the precharge circuit comprises:
a first transistor of a first conductivity type including a source being connected to a power source, a gate being connected to the control signal line, and a drain being connected to one of the pair of local bit lines; and
a second transistor of the first conductivity type including a source being connected to the power source, a gate being connected to the control signal line, and a drain being connected to another one of the pair of local bit lines, and the local write amplifier circuit comprises:
a first switching transistor including a drain being connected to one of the pair of local bit lines and a gate being connected to any of the pair of global bit lines and one of the first pair of global bit lines; a second switching transistor including a drain being connected to another one of the pair of local bit lines, a gate being connected to any of the pair of global bit lines and another one of the first pair of global bit lines, and a source being connected to a source of the first switching transistor; and
a transistor of a second conductivity type including a grounded source, a gate being connected to the control signal line, and a drain being connected to the sources of the first and second switching transistors.

5. A semiconductor memory device comprising:
a plurality of word lines extending in a row direction;
a plurality of pairs of local bit lines extending in a column direction;
a plurality of memory cells respectively arranged in row and column directions, the memory cells being connected to the word line on every row and connected to the pair of local bit lines on every column;
a pair of global bit lines extending in the column direction and corresponding to the plurality of pairs of local bit lines;
a plurality of precharge circuits each including an input terminal being connected to a control signal line and an output terminal being connected to the plurality of pairs of local bit lines, the precharge circuits being activated during a period when the control signal line is set to a first polarity; and
a plurality of local write amplifier circuits each including a data input terminal being connected to the pair of global bit lines, a control input terminal being connected to the control signal line, and an output terminal being connected to the plurality of pairs of local bit lines, the local write amplifier circuits being activated during a period when the control signal line is set to a second polarity,
wherein the precharge circuit comprises:
a first transistor of a first conductivity type including a source being connected to a power source, a gate being connected to the control signal line, and a drain being connected to one of the pair of local bit lines; and
a second transistor of the first conductivity type including a source being connected to the power source, a gate being connected to the control signal line, and a drain being connected to another one of the pair of local bit lines, and the local write amplifier circuit comprises:
a first switching transistor including a drain being connected to one of the pair of local bit lines and a gate being connected to any of the pair of global bit lines and one of the first pair of global bit lines;
a second switching transistor including a drain being connected to another one of the pair of local bit lines, a gate being connected to any of the pair of global bit lines and another one of the first pair of global bit lines, and a source being connected to a source of the first switching transistor; and
a transistor of a second conductivity type including a grounded source, a gate being connected to the control signal line, and a drain being connected to the sources of the first and second switching transistors.

6. The semiconductor memory device according to claim 1,
wherein the local read amplifier circuit comprises a differential amplifier for amplifying a small voltage difference between the pair of local bit lines, and
the global read amplifier circuit comprises a differential amplifier for amplifying a small voltage difference between any of the first pair of the global bit lines and the second pair of global bit lines.

7. The semiconductor memory device according to claim 2,
wherein the local read amplifier circuit comprises a differential amplifier for amplifying a small voltage difference between the pair of local bit lines, and
the global read amplifier circuit comprises a differential amplifier for amplifying a small voltage difference between any of the pair of the global bit lines and the second pair of global bit lines.

8. The semiconductor memory device according to claim 3,
wherein the plurality of pairs of local bit lines comprise first and second pairs of local bit lines in the column direction, and
the local read amplifier circuit comprises:
a NAND circuit including a first input terminal being connected to one of the first pair of local bit lines and a second input terminal being connected to one of the second pair of local bit lines; and an n-channel transistor including a grounded source, a gate being connected to an output terminal of the NAND circuit, and a drain being connected to the second pair of local bit lines.

9. The semiconductor memory device according to claim 4, wherein the control signal line is generated by decoding an address bus.

10. The semiconductor memory device according to claim 1, wherein the control signal line is generated by decoding an address bus.

11. The semiconductor memory device according to claim 4, wherein the control signal line is synchronized with a clock signal.

12. The semiconductor memory device according to claim 1, wherein the control signal line is synchronized with a clock signal.

13. The semiconductor memory device according to claim 4, wherein the memory array arranged in the column direction comprises sub-memory arrays obtained by dividing the memory array into a plurality.

14. The semiconductor memory device according to claim 1, wherein the memory array arranged in the column direction comprises sub-memory arrays obtained by dividing the memory array into a plurality.

15. The semiconductor memory device according to claim 4 further comprising:
a plurality of data storage circuits being respectively provided to the plurality of pairs of local bit lines, the data storage circuits each comprise:
a first pair of switching transistors for maintaining a level of the plurality of local bit lines at a time of reading; and
a second pair of switching transistors for controlling power supply to the first pair of switching transistors.

16. A semiconductor memory device comprising:
a memory array including a plurality of memory cells;
a plurality of word lines corresponding to the respective memory cells;
a pair of local bit lines corresponding to the memory array;
a pair of global bit lines corresponding to the pair of local bit lines;
a precharge circuit including an output terminal being connected to the pair of local bit lines;
a local write amplifier circuit including a data input terminal being connected to the pair of global bit lines and an output terminal being connected to the pair of local bit lines;
a control signal line being connected to an input terminal of the precharge circuit and to a control input terminal of the local write amplifier circuit,
wherein the local write amplifier circuit is deactivated by the control signal line when the precharge circuit is activated, and
the precharge circuit is deactivated by the control signal line when the local write amplifier circuit is activated;
a first switching transistor including a drain being connected to one of the pair of local bit lines and a gate being connected to another one of the pair of local bit lines;
a second switching transistor including a source being connected to a power source, a gate being connected to any of the pair of global bit lines and another one of the first pair of global bit lines, and a drain being connected to a source of the first switching transistor;
a third switching transistor including a drain being connected to one of the pair of local bit lines and a gate being connected to another one of the pair of local bit lines; and
a fourth switching transistor including a source being connected to the power source, a gate being connected to any of the pair of global bit lines and one of the first pair of global bit lines, and a drain being connected to a source of the third switching transistor.

* * * * *